United States Patent [19]

Bolk et al.

[11] Patent Number: 4,866,300
[45] Date of Patent: Sep. 12, 1989

[54] DETECTION ARRANGEMENT FOR DETECTION OF SIGNAL VARIATIONS IN A SIGNAL

[75] Inventors: Hendrik J. J. Bolk; Georges C. P. Zieltjens, both of Almelo, Netherlands

[73] Assignee: U.S. Philips Corp., New York, N.Y.

[21] Appl. No.: 183,203

[22] Filed: Apr. 19, 1988

[30] Foreign Application Priority Data

Apr. 22, 1987 [NL] Netherlands ................. 8700948

[51] Int. Cl.[4] .................................... H03K 5/24
[52] U.S. Cl. ............................ 307/358; 307/359; 328/151
[58] Field of Search ............... 307/358, 359; 328/151

[56] References Cited

U.S. PATENT DOCUMENTS

| 3,708,678 | 10/1973 | Kreda | 307/358 |
|---|---|---|---|
| 3,804,979 | 4/1974 | Knowles | 307/358 |
| 4,175,256 | 11/1979 | Dolikian | 307/358 |
| 4,213,023 | 7/1980 | Satoh et al. | 307/358 |
| 4,375,037 | 2/1983 | Ikushima | 307/358 |
| 4,635,142 | 1/1987 | Haugland | 307/358 |

FOREIGN PATENT DOCUMENTS 1066884 4/1967 United Kingdom .

Primary Examiner—John Zazworsky
Attorney, Agent, or Firm—Bernard Franzblau

[57] ABSTRACT

A detection arrangement (1) for detecting variations in a signal has an input (5) to which is supplied a signal that is processed into a reference signal by a signal processing device (2) comprising a threshold circuit (3) followed by a signal hold circuit (6). The reference signal is formed at an output (12) of the signal hold circuit (6). The signal supplied to the input (5) of the detection arrangement and the reference signal formed at the output (12) of the signal hold circuit are supplied to a comparison circuit (9). The signal processing device ensures that the reference signal formed at the output of the signal hold circuit follows peaks and valleys of the signal except for a difference value, the reference signal assuming a threshold value when a peak or a valley is reached. If the signal varies within a range determined by the difference value around the threshold value, the signal hold circuit holds the threshold value. As a result noise influences are eliminated upon detection of peaks and valleys in the signals. The signal processing device comprises means for adjusting the difference value so that it is possible to adapt the apparatus to various signal-to-noise conditions.

12 Claims, 2 Drawing Sheets

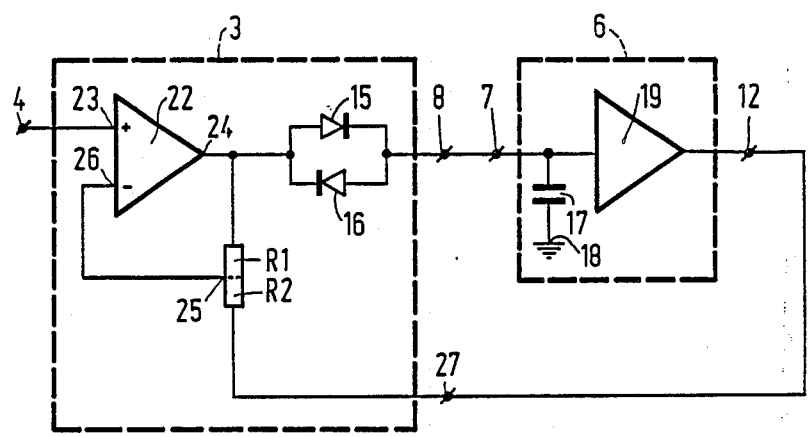
FIG. 4
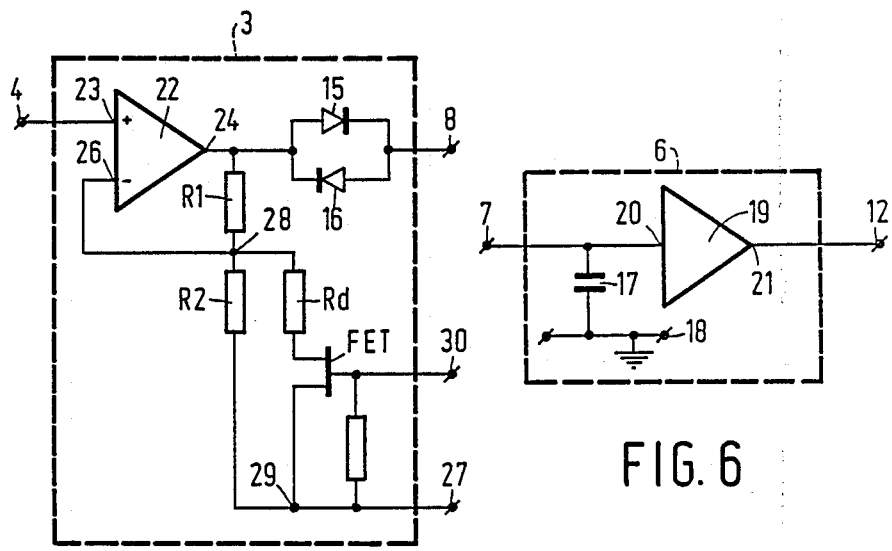
FIG. 5
FIG. 6

DETECTION ARRANGEMENT FOR DETECTION OF SIGNAL VARIATIONS IN A SIGNAL

BACKGROUND OF THE INVENTION

This invention relates to a detection arrangement for detection of signal variations in a signal comprising a signal processing device for processing the signal into a reference signal and a comparison circuit having a first input for the supply of the signal and a second input for the supply of the reference signal, an output of the comparison circuit assuming a first state if the signal has a smaller signal value than the reference signal and a second state if the signal has a larger signal value than the reference signal, while the signal processing device comprises a threshold circuit having a variable threshold value and an input for the supply of the signal, which threshold value depends upon the signal value of the signal, an output of this threshold circuit being coupled to an input of a signal hold circuit for holding the variable threshold value forming the reference signal, while, when the variable threshold value is passed with a difference value by the signal in a first and a second direction, respectively, the variable threshold value follows the signal with a lag proportional to the difference value, characterized in the threshold circuit comprises adjusting means for adjusting the difference value.

Such a detection arrangement can generally be used, for example, to detect signals disturbed by noise, such as, for example, pulsatory signals.

A detection device is known from U.S. Pat. No. 3,708,678, in which FIG. 1 shows a comparison circuit (A2), in which a signal is supplied to a first input (−) and the signal is supplied to a second input (+) via to antiparallel connected diodes and a capacitor. The signal processing circuit is therefore constituted by the diodes and the capacitor. Peaks and valleys of a signal supplied to the detection circuit can be followed, except for a difference value, such as, for example, a diode threshold voltage of a forward biased diode, even if the signal is disturbed by noise. As is described in column 4 on lines 3–10, larger difference values than one diode threshold voltage also may be attained by arranging diodes in series in the antiparallel combination. If a different number of diodes are arranged per branch in the antiparallel combination, then unequal difference values are obtained for the two signal directions. The known detection device includes means for adjusting the signal source, but does not disclose means for adjusting the difference value (i.e. the diode voltage) within the detection device. A disadvantage of the detection device described in the aforementioned U.S. Patent is that the detection device cannot be adapted to different signal-to-noise conditions, as a result of which the device cannot operate satisfactorily in unfavourable signal-to-noise conditions and/or at comparatively small signals.

SUMMARY OF THE INVENTION

An object of the invention is to provide a detection device which, inter alia, in unfavourable signal-to-noise conditions will operate satisfactorily.

A detection device of the kind mentioned in the opening paragraph is for this purpose characterized in that the threshold circuit comprises adjusting means for adjusting the difference value. In the case of a signal having a comparatively small signal amplitude, which is not drowned excessively in the noise, a small difference value can be adjusted, while at a comparatively large signal amplitude and a large amount of noise a large difference value can be adjusted. The difference value can be adapted to various signal-to-noise conditions.

An embodiment of a detection device according to the invention is characterized in that the adjusting means comprise a differential amplifier, a first input of which is coupled to the input of the threshold circuit, an output of which is coupled to an antiparallel combination of rectifier elements and a second input of which is coupled to a centre tapping of a variable voltage divider, which is coupled at one side to the output of the differential amplifier and at another side to the output of the signal hold circuit. As a result, the difference value is adjustable from zero to a multiple of the threshold value of a forward biased rectifier element. If a different number of rectifier elements are arranged in the branches of the antiparallel combination, for the opposite signal directions an unequal difference value will occur.

A further embodiment of a detection device according to the invention, in which the signal hold circuit comprises a hold element for holding the variable threshold value, is characterized in that the signal hold circuit further comprises a buffer amplifier, an input of which is coupled to the hold element, which is coupled to an input of the signal hold circuit, an output of the buffer amplifier being coupled to an output of the signal hold circuit. The hold element, for example a capacitor, can have a comparatively small capacitance value. The buffer amplifier, when constructed, for example, as an operational amplifier, will have a high-ohmic input. In such an embodiment the detection device will be suitable for comparatively low to comparatively high frequencies.

BRIEF DESCRIPTION OF THE DRAWINGS

The invention will be described more fully with reference to the accompanying drawing, in which:

FIG. 4 shows a first embodiment of an adjusting means for adjusting the difference value in a detection arrangement according to the invention, FIG. 5 shows a second embodiment of an adjusting means for adjusting the difference value in a detection arrangement according to the invention, and FIG. 6 shows an embodiment of a signal hold circuit in a detection arrangement according to the invention.

DESCRIPTION OF THE PREFERRED EMBODIMENTS

Figure 1:
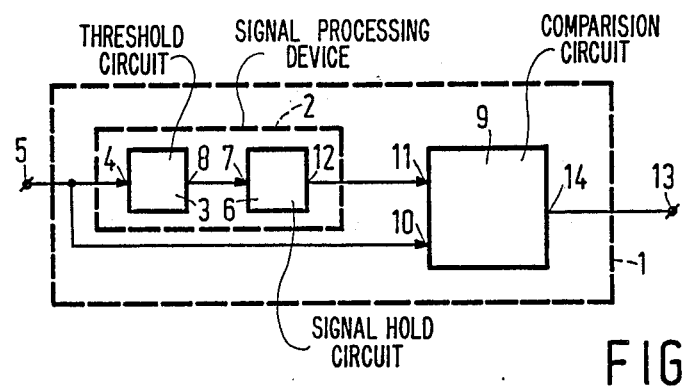
FIG. 1 shows the principle circuit diagram of a detection arrangement.

FIG. 1 shows the principal circuit diagram of a detection arrangement 1. The arrangement 1 comprises a signal processing device 2. The signal processing device 2 comprises a threshold circuit 3, of which an input 4 is coupled to an input 5 of the detection arrangement 1. Further, the signal processing device 2 comprises a signal hold circuit 6, of which an input 7 is coupled to an output 8 of the threshold circuit 3. The detection arrangement 1 further comprises a comparison circuit 9, of which a first input 10 is coupled to the input 5 of the detection arrangement 1 and of which a second input 11 is coupled to an output 12 of the signal hold circuit 6. The detection arrangement 1 is provided with an output 13 which is coupled to an output 14 of the comparison circuit 9.

Figure 2:
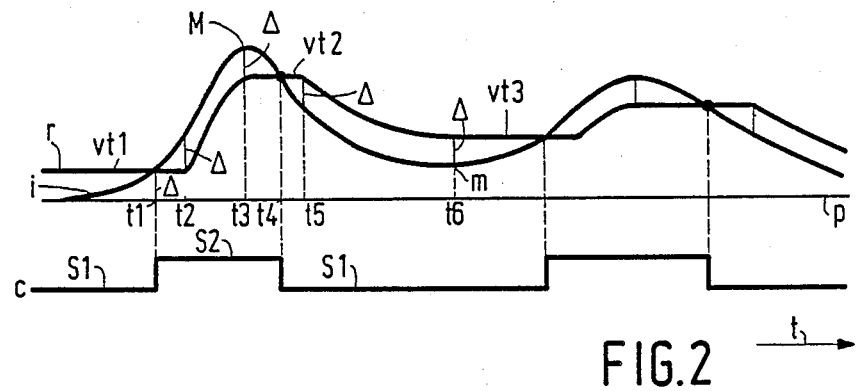
FIG. 2 shows for explanation of the operation of the detection arrangement a waveform diagram of a signal together with the variation of the reference signal and a threshold value therein, and also an output signal of the comparison circuit.

The operation of the arrangement will be explained more fully with reference to FIG. 2, which shows a signal i for supply to the input 5 of the detection arrangement 1 together with the variation of a reference signal r appearing at the output 12 of the signal hold circuit 6, and further shows an output signal c at the output 14 of the comparison circuit 9, all as a function of the time t. In FIG. 2, t1 to t6 indicate a few time instants, Δ designates a difference value and vt1, vt2 and vt3 designate variable threshold values. In the following description it is assumed that the signal i is a signal of which a direct current component is restored while in FIG. 2 the signal i is indicated with respect to a zero level p. It is assumed that the detection arrangement 1 is provided with supply terminals (not shown) for connecting a supply voltage including ground potential. For the description of the operation of the detection arrangement 1, it is assumed that the signal i is applied to the input 5 of the detection arrangement 1 and that the supply voltage is connected. Further, as an initial condition it is assumed that the signal i has the zero level p, that the output 12 of the signal hold circuit 6 has the difference value Δ and that the output 14 of the comparison circuit 9 has a state s1. As long as the signal i lies below the variable threshold value vt1, the threshold value vt1 will be held by the signal hold circuit 6. When the signal i passes the reference signal r having the threshold value vt1 at the instant t1, the output 14 of the comparison circuit 9 passes from the state s1 to a state s2. The reference signal r and hence the threshold value vt1 do not vary. The reference signal r will not vary upon an increase of the signal i until the signal difference between the signal i and the threshold value vt1 amounts to the difference value Δ. This occurs at the instant t2. Upon a further increase of the signal i, from the instant t2 the referene signal r will follow the signal i while maintaining the difference value Δ. When the signal i reaches a peak value M at the instant t3, the reference signal r does not increase further and a new variable threshold value vt2 has been adjusted. If the pulsatory signal i decreases from the instant t3 and passes the reference signal r at the instant t4, the output 14 of the comparison circuit 9 passes from the state s2 to the state s1, but the reference signal r still retains the threshold value vt2 until the signal i falls below the threshold value vt2 by the difference value Δ (at t5). The reference signal r will again follow the signal i from the instant t5. Upon a further decrease of the signal i, the reference signal r follows the signal i except for the difference value Δ. At the instant t6, at which the signal i reaches a valley m, a new state of equilibrium is adjusted, the reference signal r remains constant and a new threshold value vt3 has been adjusted. Upon a following increase or decrease of the signal i, the process described is repeated so that the threshold value is adapted dynamically to the signal i. The difference value Δ around the threshold value, which is produced by the threshold circuit 3, renders the detection arrangement 1 to a certain extent insensitive to noise superimposed on the signal i, as far as the noise lies in a range determined by the difference value Δ.

Figure 3:
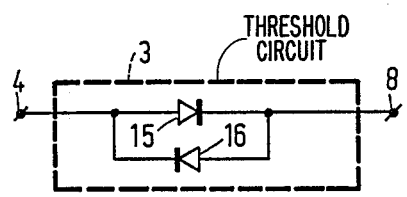
FIG. 3 shows an embodiment of a threshold circuit in a detection arrangement.

FIG. 3 shows an embodiment of a threshold circuit 3. The threshold circuit 3 comprises a first (15) and a second (16) rectifier element connected in parallel opposition and coupled to the input 4 and the output 8, respectively, of the threshold circuit 3. In this embodiment, diodes are shown as the rectifier elements. A forward voltage drop th of the diodes forms the difference value Δ. Several diodes can be arranged in series in each branch.

FIG. 4 shows a first embodiment of an adjusting means for adjusting the difference value Δ, in which the threshold circuit 3 is coupled in the manner described to the signal hold circuit 6. The adjusting means forms a part of the threshold circuit 3 and comprise a differential amplifier 22, of which a first (+) input 23 is coupled to the input 4 of the threshold circuit 3. An output 24 of the differential amplifier 22 is coupled to the rectifier elements 15 and 16. A voltage divider comprising a series-combination of resistors R1 and R2 is coupled via a junction point of the resistors R1 and R2, i.e. center tapping 25, to a second input 26 of the differential amplifier 22. Further, one terminal of R1 is coupled to the output 24 of the differential amplifier 22 and R2 one terminal of R2 is coupled through a connection terminal 27 to the output 12 of the signal hold circuit 6. In a practical situation, the voltage divider is chosen to be variable and is, for example, a potentiometer. By the adjusting means shown, a difference value Δ can be adjusted so that adaptation to the signal-to-noise ratio of the signal i is possible. With the use of, for example, a diode as the rectifier element having a forward voltage drop th, the difference value is:

$$\Delta = \{R2/(R1+R2)\} \cdot th,$$

which can simply be verified by reference to the circuit shown. The difference value Δ is therefore adjustable between Δ=0 and Δ=th.

FIG. 5 shows a second embodiment of the adjusting means for adjusting the difference value Δ, which adjusting means are included in the threshold circuit 3. The differential amplifier 22 and the resistors R1 and R2 are arranged in the same mannor as in FIG. 4. The adjustment of the difference value Δ is obtained in the embodiment shown by arranging parallel to R2 a field effect transistor FET connected as a variable resistor, a terminal 28 of the resistor R2 being connected to a resistor Rd, which resistor Rd is further connected to the drain electrode of the field effect transistor FET, while another terminal 29 of the resistor R2 is connected to the source electrode of the field effect transistor FET. When the field effect transistor FET is driven at its gate electrode by a control input 30, the equivalent resistance R2' of the parallel-combination of the resistor R2 and the field effect transistor FET is varied. In the said formula for the difference value Δ, R2 should then be replaced by R2'. The gate electrode of the field effect transistor FET may be driven, for example, from a digital-to-analog converter with a current output (not shown), as a result of which the difference value Δ of the detection arrangement 1 can be driven from a computer (not shown).

FIG. 6 shows an embodiment of a signal hold circuit 6, according to the invention, which comprises a hold element 17 which is coupled to the input 7 of the signal hold circuit 6 and further to a connection terminal 18 at ground potential. The signal hold circuit 6 further comprises a buffer amplifier 19, of which an input 20 is coupled to the hold element 17 and of which an output 21 is coupled to the output 12 of the signal hold circuit 6. In the embodiment shown, a capacitor is chosen as the hold element and the buffer amplifier 19 ensures that the hld element 17 is not loaded by further circuits coupled thereto.

The invention is not limited to the embodiments shown since many variations will be apparent to those skilled in the art within the scope of the invention. For example, the field effect transistor FET in the threshold circuit 3 may be connected parallel to R1 instead of parallel to R2. Further, the parallel-combination of the field effect transistor FET and R1 or R2 may be replaced by an element whose resistance value can vary under the influence of light, such as a light-dependent resistor contained in the same housing as a light source.

What is claimed is:

1. A detection arrangement for detection of variations in a signal comprising, a signal processing device for processing the signal into a reference signal, a comparison circuit having a first input for receiving the signal and a second input for receiving the reference signal, an output of the comparison circuit assuming a first state if the signal has a lower signal value than the reference signal and a second state if the signal has a higher signal value than the reference signal, wherein the signal processing device comprises a threshold circuit having a variable threshold value and an input for receiving the signal, which threshold value depends upon the value of the signal at the input of the threshold circuit, an output of the threshold circuit being coupled to an input of a signal hold circuit which holds the variable threshold value forming the reference signal, wherein the threshold circuit produces a variable threshold value that follows the signal with a lag equal to a difference value when the signal passes through the threshold value by the difference value in a first and second direction, wherein the threshold circuit comprises means for adjusting the difference value.

2. A detection arrangement as claimed in claim 1, wherein the adjusting means comprise a differential amplifier having a first input coupled to the input of the threshold circuit and an output coupled to an antiparallel combination of rectifier elements, and means coupling a second input of the differential amplifier to a tapping of a variable voltage divider which is coupled between the output of the differential amplifier and an output of the signal hold circuit.

3. A detection arrangement as claimed in claim 2, wherein the signal hold circuit comprises a hold element for holding the variable threshold value, characterized in that the signal hold circuit further comprises a buffer amplifier having an input coupled to the hold element, said hold element being coupled to the input of the signal hold circuit, an output of the buffer amplifier being coupled to an output of the signal hold circuit.

4. A detection arrangement as claimed in claim 1 wherein the signal hold circuit comprises, a hold element coupled to the input of the signal hold circuit for holding the variable threshold value and a buffer amplifier having an input coupled to the hold element and an output coupled to an output of the signal hold circuit.

5. A signal processing apparatus for monitoring a signal in the presence of noise, said apparatus comprising:
an input terminal for receiving said signal,
an output terminal for supplying a binary type signal,
a comparison circuit having an output coupled to said output terminal and having first and second inputs,
means coupling said first input of the comparison circuit to said input terminal,
means connecting a threshold circuit and a signal hold circuit in cascade, in the order named, between said input terminal and the second input of the comparison circuit so as to derive and apply a reference signal to said second input,
the comparison circuit producing a signal at its output that assumes a first value when the signal at the second input is lower than the reference signal and which assumes a second value when said signal is higher than the reference signal, and wherein the threshold circuit comprises;
means responsive to said signal for producing a further signal having a variable threshold value that automatically follows the amplitude of said signal with a lag equal to a difference value when the signal is greater than or less than the threshold value by an increment equal to the difference value,
means for continuously adjusting the amplitude of the difference value, and
means for coupling said further signal to an input of the signal hold circuit which in turn supplies a reference signal of variable threshold value to said second input of the comparison circuit.

6. A signal processing apparatus as claimed in claim 5, wherein the threshold circuit further comprises a parallel circuit including at least first and second rectifier elements coupled with opposite polarity between an input and an output of the threshold circuit.

7. A signal processing apparatus as claimed in claim 6, wherein said parallel circuit comprises first and second branches where the first branch includes at least one more rectifier element than the second branch.

8. A signal processing apparatus as claimed in claim 5, further comprising a feedback path between the output of the signal hold circuit and an input of the threshold circuit.

9. A signal processing apparatus as claimed in claim 8, wherein the threshold circuit comprises a differential amplifier having a first input coupled to a second input of the threshold circuit which receives said signal, an output of the differential amplifier being connected via at least first and second anti-parallel coupled rectifier elements to the input of the signal hold circuit, and
a voltage divider coupled to the output of the differential amplifier and to the first input of the threshold circuit and with a tap point coupled to a second input of the differential amplifier.

10. A signal processing apparatus as claimed in claim 5, wherein the threshold circuit comprises a differential amplifier having a first input coupled to a first input of the threshold circuit, an output coupled via at least first and second rectifier elements coupled in anti-parallel to the input of the signal hold circuit, and a voltage divider coupling said output of the differential amplifier to a second input thereof.

11. A signal processing apparatus as claimed in claim 10, further comprising:
a feedback path coupled between the output of the signal hold circuit and second input of the threshold circuit, wherein
said voltage divider is coupled to said second input of the threshold circuit, a controlled semiconductor device connected in parallel with at least a part of said voltage divider, and means coupling a control electrode of the semiconductor device to a control input of the threshold circuit which control input provides a control voltage for adjusting said difference value.

12. A signal processing apparatus as claimed in claim 5, wherein the threshold circuit has a fast response time relative to the input signal such that said lag is short in relation to the period of said signal.

* * * * *